United States Patent [19]

Bousman

[11] Patent Number: 5,083,238

[45] Date of Patent: Jan. 21, 1992

[54] HIGH FREQUENCY ELECTRONIC ASSEMBLY

[75] Inventor: Thomas W. Bousman, Mesa, Ariz.

[73] Assignee: Motorola, Inc., Schaumburg, Ill.

[21] Appl. No.: 650,327

[22] Filed: Feb. 4, 1991

[51] Int. Cl.⁵ .................... H01B 7/08; H01R 23/68
[52] U.S. Cl. ............................ 361/413; 174/72 R; 174/117 F; 174/117 FF; 174/268; 361/415; 361/428; 439/502
[58] Field of Search ...... 174/117 F, 117 FF, 117 PC, 174/268, 71 R, 72 R; 439/502; 361/412, 413, 415, 428, 398

[56] References Cited

U.S. PATENT DOCUMENTS

| | | | |
|---|---|---|---|
| 3,459,879 | 8/1969 | Gerpheide | 174/117 FF |
| 3,612,744 | 10/1971 | Thomas | 174/36 |
| 3,670,639 | 6/1972 | Harnden, Jr. | 361/398 X |
| 3,878,341 | 4/1975 | Balde | 174/117 FF X |
| 4,219,928 | 9/1980 | Kuo | 174/117 FF X |
| 4,237,546 | 12/1980 | Wells | 361/413 X |
| 4,255,853 | 3/1981 | Campillo et al. | 439/502 |
| 4,481,379 | 11/1984 | Bolick, Jr. et al. | 174/117 F X |
| 4,639,693 | 1/1987 | Suzuki et al. | 174/117 FF X |
| 4,845,315 | 7/1989 | Stopper | 361/428 |
| 4,879,433 | 11/1989 | Gillett et al. | 174/117 FF X |

Primary Examiner—Morris H. Nimmo
Attorney, Agent, or Firm—Walter W. Nielsen

[57] ABSTRACT

An electronic assembly comprising a plurality of printed circuit boards residing in a chassis and a removable high frequency, multi-conductor flexible cable, having a connector at each end, the structure of said cable being such that, if positioned in a single plane, it has a plurality of substantially rigid turns, the sum of the degrees of arc of such turns in one direction being equal to the sum of the degrees of arc of such turns in the opposite direction, such that the conductors have equal lengths throughout the cable, resulting in matched signal lengths throughout the cable.

To provide optimum shielding, the cable is formed of a plurality of pairs of conductors, each pair is separated by a ground conductor, and the top and bottom of the cable are ground planes.

The electronic assembly comprises a plurality of cables arranged to interconnect printed circuit boards within one or more chassis so as to permit relatively unobstructed air flow both between and above the boards and to permit boards to be readily inserted and removed.

8 Claims, 4 Drawing Sheets

HIGH FREQUENCY ELECTRONIC ASSEMBLY

TECHNICAL FIELD

This invention relates generally to electronic equipment packaging and, in particular, to a high frequency electronic assembly comprising a plurality of electronic circuit boards interconnected by a plurality of flexible cables.

BACKGROUND OF THE INVENTION

The present invention has utility in packaging electronic equipment, particularly in data processing systems where signal transmission may occur at very high clock speeds, for example, above 100 MHz.

It is known to interconnect electronic printed circuit boards in a card cage or other form of chassis, utilizing, for example, coaxial and multi-coaxial cable, ribbon cable, fiber optic cable, and the like. In this way, power, data, and control signals may be conducted between circuit boards.

In data processing systems wherein signals are transmitted at very high clock speeds it is desirable to have cabling which provides a matched signal length. That is, two or more signals generated simultaneously into a cable should arrive simultaneously at the other end of the cable. The term "signal skew", as used hereinafter, refers to the extent one such signal arrives ahead of another through a transmission medium. Because of the very high speed operation of the logic circuits in such a data processing system, incorrect logic states can result if signals are delayed relative to other signals.

It is also desirable to provide a cable which is substantially immune from noise. In addition, the cable should have minimal signal attenuation.

In dense electronic packaging configurations, utilizing high speed logic, wherein a significant amount of heat may be generated, it is also desirable to minimize cable interconnections which would block the flow of a coolant fluid, such as air, through the packaging structure.

BRIEF SUMMARY OF INVENTION

The present invention provides a high frequency electronic assembly comprising a plurality of circuit boards interconnected by a cable comprising a multiplicity of signal paths of equal length.

A significant factor in achieving matched signal length in the cable is the fact that the sum of the degrees of arc of the cable turns in one direction are equal to the sum of the degrees of arc of the cable turns in the opposite direction, assuming the turns all have the same average radius, so that the cable conductors have equal lengths throughout the cable. As a result, each signal traverses exactly the same length of signal path, and the electronic assembly accordingly will accommodate very high clock frequencies by minimizing signal skew.

The cable may comprise a connector at one or both ends. In a preferred embodiment, the cable is thin and flexible, enabling it to be easily routed between circuit boards. The thin profile of the cable is a significant factor in allowing the free flow of a cooling medium through the cable interconnection area between, as well as above, the circuit boards. The cable flexibility, length, shape, and location relative to the circuit boards also permit circuit boards to be easily inserted and removed from the card cage.

The cable comprises a plurality of differential pairs of conductors. Each differential pair is electrically isolated horizontally from the adjacent differential pair by a ground conductor. In addition, the layer of conductors is shielded above and below by a ground plane. The resultant cable has excellent noise immunity.

An electronic assembly built utilizing the cabling disclosed and described herein operates with a higher bandwidth than one built utilizing known ribbon cable, and it has increased signal density over one built utilizing known multi-coaxial cabling.

Accordingly, it is an advantage of the present invention to provide an electronic assembly which is capable of high frequency operation and which is relatively immune from noise.

It is another advantage of the present invention to provide an electronic assembly which utilizes cabling having matched signal lengths for a multiplicity of conductors.

It is also an advantage of the present invention to provide an electronic assembly which utilizes cabling which permits adequate cooling of circuit boards and which facilitates insertion and removal of circuit boards.

These and other advantages are achieved in accordance with a preferred embodiment of the invention by providing an electronic assembly comprising a plurality of circuit boards, each containing connector means, and at least one multi-conductor, flexible, thin cable, the cable comprising means for coupling to the connector means, and the structure of the cable being such that, if positioned in a single plane, it has a plurality of substantially rigid turns, the sum of the degrees of arc of the turns in one direction being equal to the sum of the degrees of arc of the turns in the opposite direction, so that the conductors have equal lengths throughout the cable.

BRIEF DESCRIPTION OF THE DRAWINGS

The invention is pointed out with particularity in the appended claims. However, other features of the intentions will become more apparent and the invention will be best understood by referring to the following detailed description in conjunction with the accompanying drawings in which:

DETAILED DESCRIPTION OF A PREFERRED EMBODIMENT

Figure 1A:
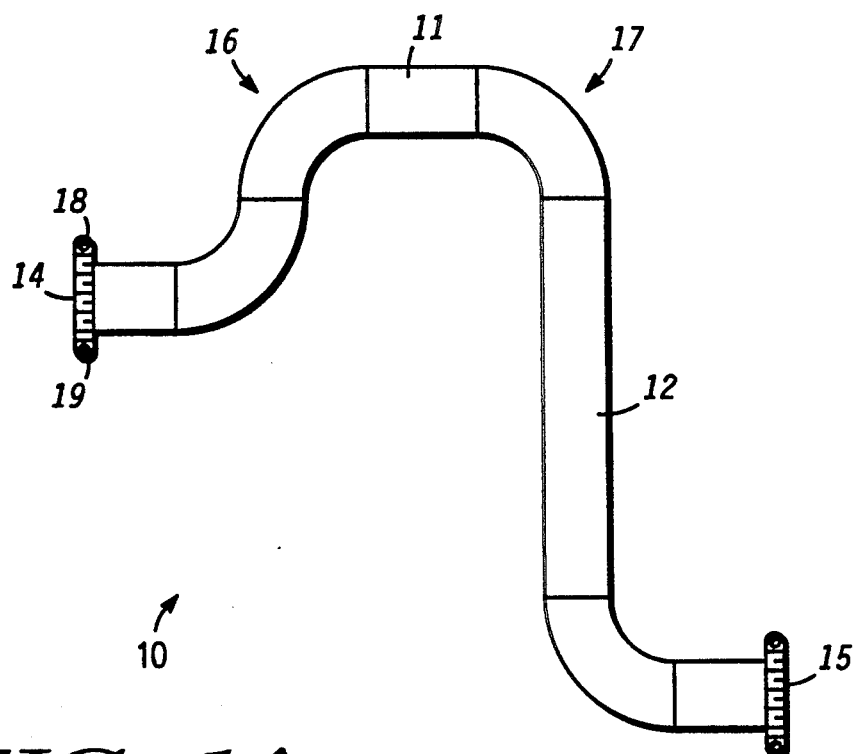
FIG. 1A shows a flexible cable used in a preferred embodiment of the invention.

With reference now to FIG. 1A, a flexible cable 10 as used in a preferred embodiment of the invention is shown. Cable 10 is a thin, flat, multi-conductor cable.

The geometry and composition of a preferred embodiment of cable 10 is such that, if cable 10 is positioned in a single plane, it has a plurality of substantially rigid turns, such as the turns indicated by reference numerals 16 and 17, and a plurality of relatively straight segments, such as segments 11 and 12. However, it will be understood by one of ordinary skill in the art that the cable may comprise only bends without straight segments.

The turns or bends, such as turns 16 and 17, are shown to be each approximately 90 degrees. However, they may be any appropriate angle. Moreover, each turn may be of a different angle if desired. It is essential, however, that the sum of the degrees of arc of the turns in one direction be equal to the sum of the degrees of arc of the turns in the opposite direction, in order that the internal conductors have equal lengths throughout the cable, and therefore have equal signal paths.

For example, if cable 10 makes two 90-degree turns to the left, it must also make two 90-degree turns to the right (giving a total of 180 degrees of arc in each direction).

Alternatively, cable 10 could make a 45-degree turn to the left, followed by a 135-degree turn to the right, and then a 90-degree turn to the left (giving a total of 135 degrees of arc in each direction).

It is assumed, too, that the turns all have the same average radius. Otherwise, if the radius of curvature for a right-hand turn were greater or smaller than that for a left-hand turn, the internal cable conductors would not be of equal length.

Regarding turns 16 and 17, when cable 10 is positioned in a single plane, for example, by laying it on a table, it remains substantially rigid when an attempt is made to bend it while keeping it within the single plane. However, it is flexible when any part is bent out of the single plane, for example, by bending the end containing connector 15 up from the table.

Cable 10 may be constructed of a number of parallel conductors laminated in a flexible insulating material. In a preferred embodiment, the conductors are copper, and the insulating material is a polyimide such as Kapton ® material. The dielectric properties of the Kapton ® insulating material depend upon the thickness of the insulating layer and the width of the conductors (also referred to as "traces"). The resulting cable is a controlled-impedance stripline cable.

Cable 10 comprises connectors 14 and 15 at each end. As shown, connector 14 may be a flat connector of known type having an exposed pattern of conductive elements, each of which is coupled to a corresponding one of the conductors in the cable. The connectors may take the form, for example, of the INVISICON ® surface-mounted termination system commercially available from Rogers Corporation in which exposed conductors lying within the plane of the cable are clamped against a mating pattern of conductors on the circuit board.

The cable connectors 14 and 15 may be secured to corresponding connectors on circuit boards, for example, by positioning the cable connector above its mating connector on the circuit board and tightening down suitable screws or bolts in holes 18 and 19.

Figure 1B:
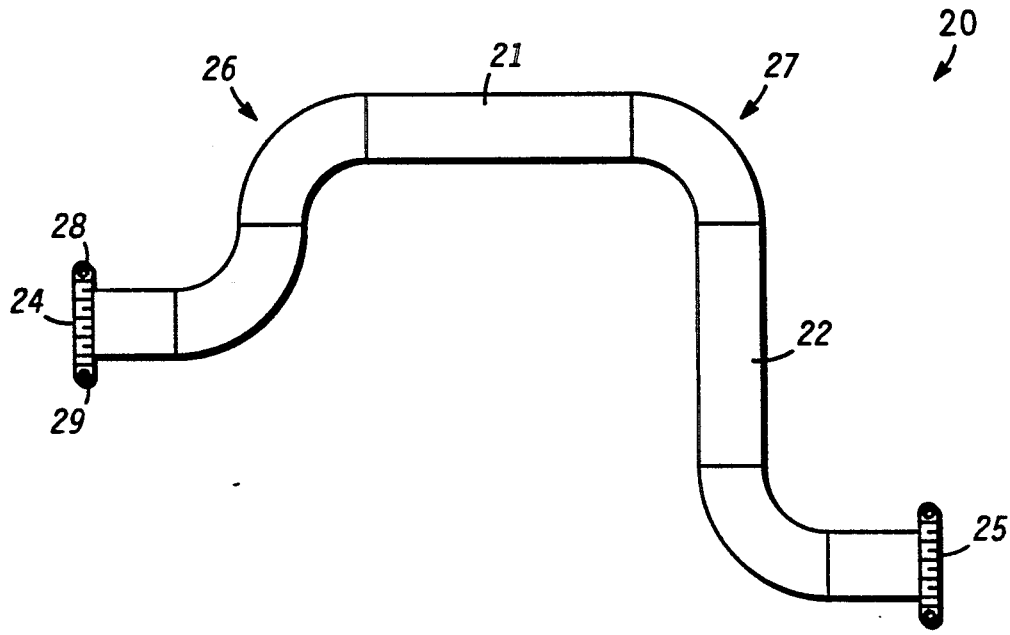
FIG. 1B shows a cable identical to that illustrated in FIG. 1A except for certain physical dimensions.

FIG. 1B shows a cable 20 identical to that illustrated in FIG. 1A except for certain physical dimensions. For example, cable 20 has a segment 21 that is longer in dimension than corresponding segment 11 of cable 10.

And segment 22 of cable 20 is shorter than corresponding segment 12 of cable 10.

In all other respects cable 20 is identical to cable 10. Cables may be constructed in any suitable geometry, with varying lengths and widths, and with turns of varying angles (provided the sum of the angles to each direction is identical, as mentioned above) as required by the particular configuration of the circuit boards and card cage or other chassis.

Figure 2:
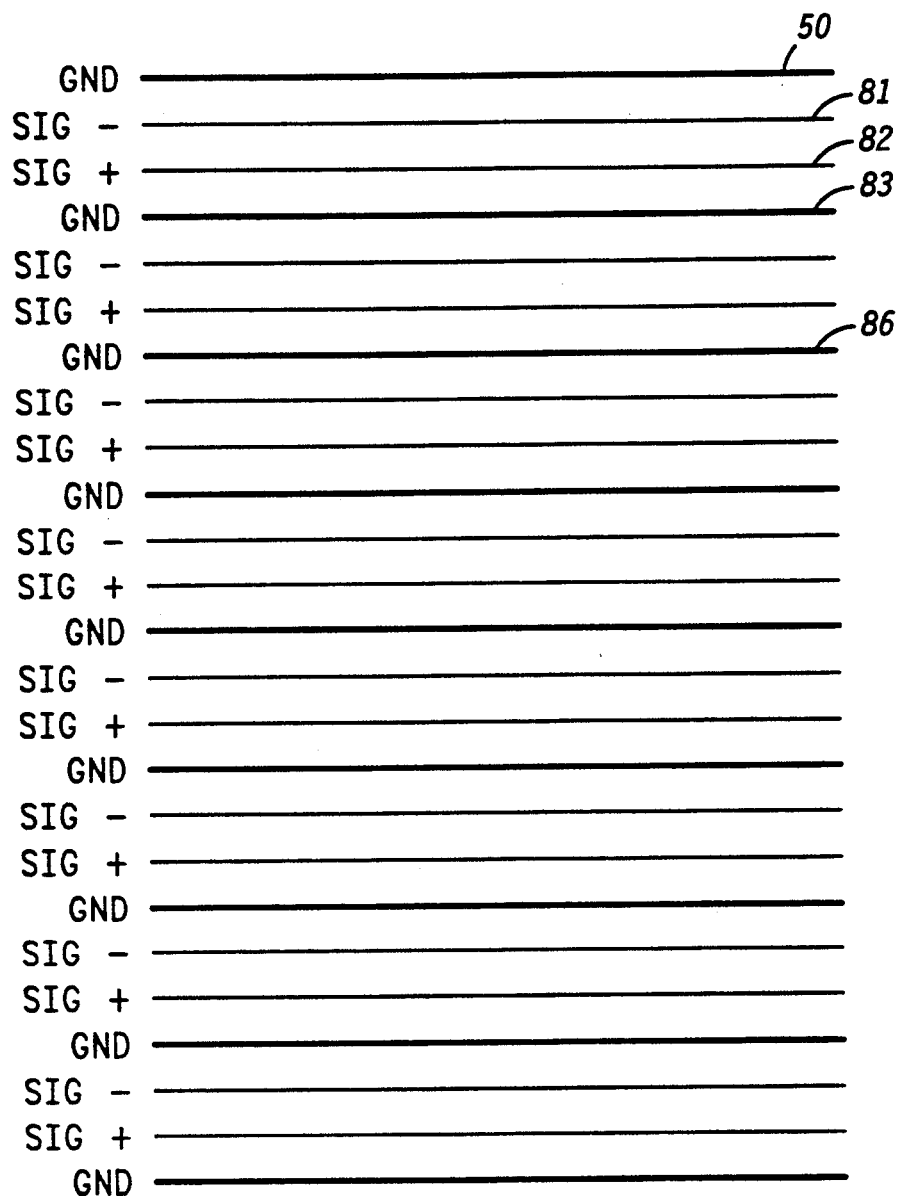
FIG. 2 shows how the signal conductors are arranged in the cable illustrated in FIGS. 1A and 1B.

FIG. 2 shows how the conductors are laid out in the cables illustrated in FIGS. 1A and 1B. The conductors shown in FIG. 2 correspond to those which are positioned between one edge of the cable and the opposite edge and which run from one end of the cable to the other end parallel to the edges thereof.

Signals are transmitted via pairs of conductors, referred to as differential signal pairs, such as conductors 81 and 82, wherein conductor 81 is at a negative potential with reference to conductor 82, and vice versa. Each differential pair of conductors is separated from the edge of the cable or from an adjacent pair by a ground conductor, such as conductors 80, 83, and 86, in order to provide noise immunity between adjacent signal pairs. In a preferred embodiment the cable comprises eight differential pairs of conductors.

Figure 3:
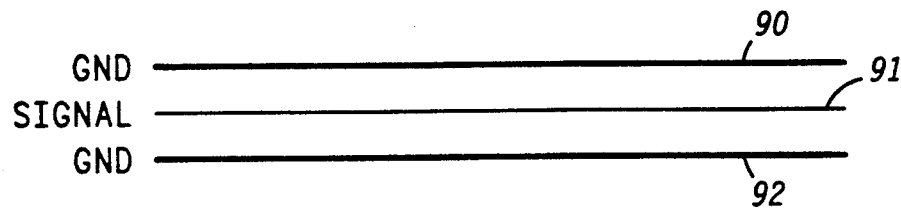
FIG. 3 shows a cross-section through the plane of the cable illustrated in FIGS. 1A and 1B.

FIG. 3 shows a cross-section of the cable illustrated in FIGS. 1A and 1B, viewing the cable perpendicular to an edge thereof. The signal layer 91 (comprising a multiplicity of differential signal pairs and isolating ground conductors, as shown in FIG. 2) is isolated by ground planes 90 and 92, to provide noise immunity and impedance control to the signal conductors in signal layer 91.

It will be apparent to one of ordinary skill that the cable could comprise multiple layers of signal conductors, each isolated by a ground plane.

Figure 4:
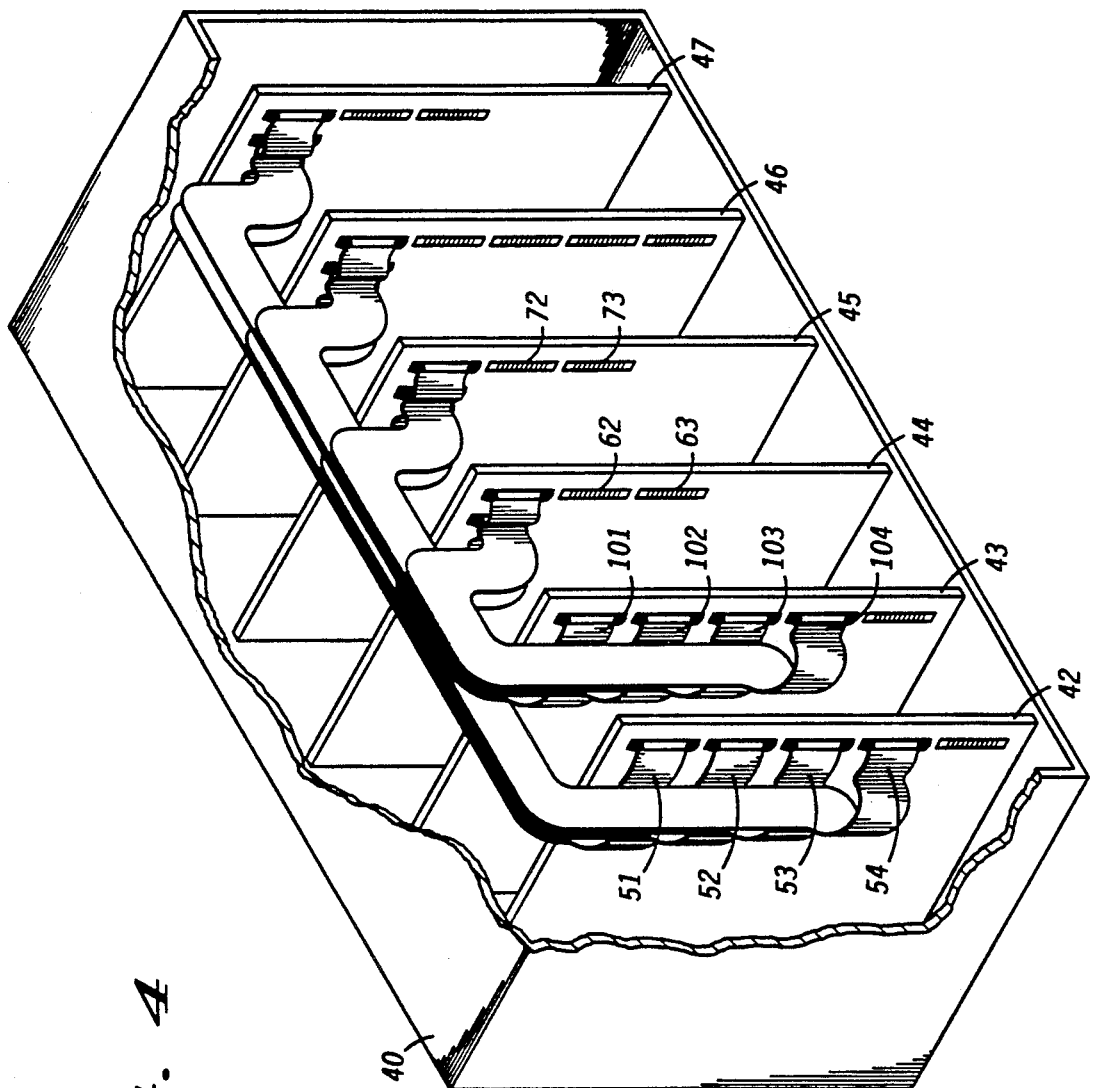
FIG. 4 illustrates a preferred embodiment of the invention in the form of a card cage assembly comprising a plurality of electronic circuit boards interconnected by a plurality of cables.

FIG. 4 illustrates a preferred embodiment of the invention in the form of a card cage assembly 40, comprising a plurality of electronic circuit boards 42-47 which are interconnected by a plurality of cables 51-54 in accordance with the present invention.

Figure 5:
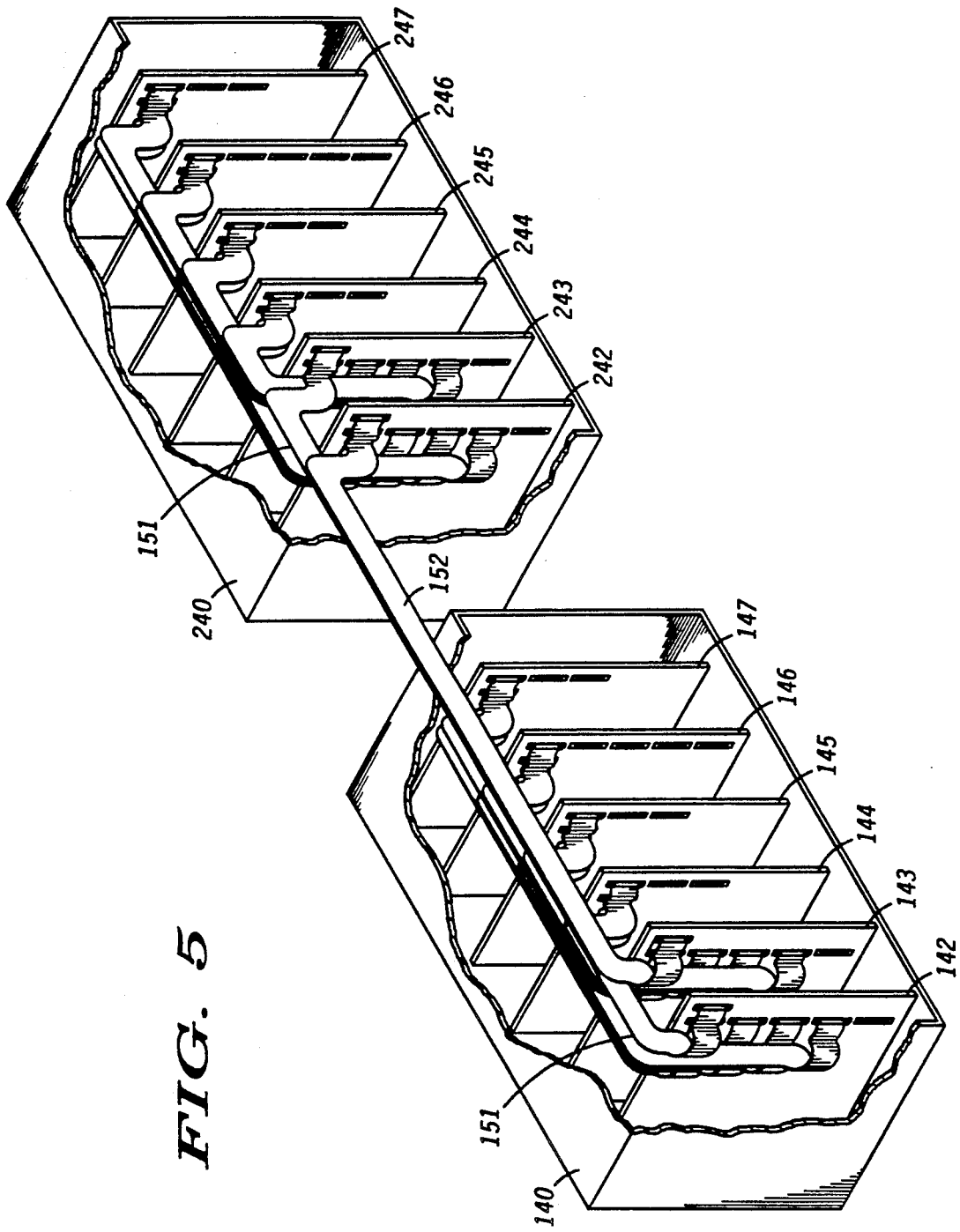
FIG. 5 illustrates an alternative embodiment of the invention comprising a plurality of card cage assemblies the electronic circuit boards of which are interconnected by a plurality of cables.

In a preferred embodiment, circuit boards 44-47 are "processing elements" which perform substantially equivalent processing functions, while circuit boards 42 and 43 are "switch units" which perform a switching function among the processing element boards 44-47 and between the processing element boards 44-47 and the switch units of other assemblies (not shown in FIG. 4 but shown in and discussed regarding FIG. 5).

Circuit board 42, for example, may be an input switch unit, and circuit board 43 may be an output switch unit. Circuit board 42 receives input signals from other output switch unit boards (not shown in FIG. 4) and routes them to the input ports of the processing element boards 44-47 to which circuit board 42 is coupled. Likewise, circuit board 43 receives output signals from output ports of processing element boards 44-47 and routes them to other input switch unit boards (again not illustrated in FIG. 4).

Each circuit board has on the surface thereof a matching connector, such as connectors 62 and 63 on circuit board 44. While in a preferred embodiment, the connectors on the cable and on the circuit board are flat, surface connectors, the connectors can be of any other suitable type.

As shown in FIG. 4, cable 51 couples input switch unit board 42 to processing element board 47; cable 52 couples board 42 to board 46; cable 53 couples board 42 to board 45; and cable 54 couples board 42 to board 44.

Correspondingly, cables 101-104 couple output switch unit board 43 to processing element boards 47, 46, 45, and 44, respectively.

To provide equal signal propagation times in all of the cables coupling a given switch unit board to its associated processing element boards, each cable is the same length. For example, cables 51-54 are of equal length, as are cables 101-104.

Assuming it is desired to employ the same length and same general shape for each cable in the group of cables (51-54 or 101-104) associated with a given switch unit board (42 or 43, respectively), and that it is also desirable to position such cables smoothly along side each other with minimum cable ripple or buckle, then the spacing between adjacent cards is preferably made identical to that between adjacent card connectors. For example, the spacing between cards 43 and 44 is made identical to the distance between card connectors 62 and 63.

It is seen from FIG. 4 that cables 51-54 and 101-104 present minimal physical obstruction of a cooling fluid, such as air, between the circuit boards. Because the cables are flexible and bendable away from their plane, they may be bent and folded to achieve the optimum routing. They may also be positioned adjacent one another. For example, cables 51-54 may be positioned adjacent one another above cards 42-46 and appropriately secured together, if desired, with suitable means such as one or more cable fasteners (not illustrated).

The flexibility of the cables permits individual circuit boards to be readily inserted into or removed from the card cage assembly 40. For example, to remove board 43, one first loosens the board from suitably provided mounting means (not illustrated) and pulls it slightly out of the card cage (as seen in FIG. 4, to the right, in a direction parallel to the top and bottom edges of the card) sufficiently to expose the fastening screws on the connectors to enable the screws to be removed. Once the connectors on cables 101-104 are removed from board 43, the board can be completely removed from the card cage 40. Re-installation of board 43 merely involves a reversal of the above-described procedure.

FIG. 5 illustrates an alternative embodiment of the invention comprising a plurality of card cage assemblies 140 and 240. The electronic circuit boards of these card cages are interconnected by a plurality of cables.

In the embodiment of FIG. 5 each card cage assembly 140 and 240 comprises four processing elements and two switch units. One switch unit functions as an input to the four processing element boards to which it is coupled, and the other switch unit functions as an output from its four associated processing element boards. In FIG. 5 the cable connections between the two switch unit boards and the four processing element boards is shown substantially as depicted previously in FIG. 4.

To enable each processing element board to communicate with each other processing element board, the switch unit boards together function as a 4×4 switch.

Switch unit board 142, for example, may be an input switch unit, and switch unit board 143 may be an output switch unit. Switch unit board 142 receives input signals from another output switch unit board, such as output switch unit board 243, and routes them to the input ports of the processing element boards 144-147 to which circuit board 142 is coupled. Likewise, output switch unit board 143 receives output signals from output ports of processing element boards 144-147 and routes them to another input switch unit board, such as input switch unit boards.

To make the above-described connections, an input port on each input switch unit board is coupled by a cable to an output port on another output switch unit boards. For example, an input port on input switch board 142 is coupled to an output port on output switch unit board 243 via cable 151.

Likewise, cable 152 couples an output port on output switch board 143 to an input port on input switch board 242.

The cable harness is so constructed, both regarding the length of its constituent segments and regarding the sum of the degrees of arc of the turns in each direction, that the conductors in any given cable segment have equal lengths, in order to assure that the signal paths are identical among the conductors of any given cable segment.

It will be apparent to those skilled in the art that the disclosed invention may be modified in numerous ways and may assume many embodiments other than the preferred form specifically set out and described above.

For example, the cable could be a single-ended conductor. In addition, rather than use a stripline cable comprising shielding layers above and below the signal conductors, one or both shielding layers could be eliminated; however, this configuration would likely be more susceptible to noise.

Other suitable conductive materials could be employed for the signal traces, and other suitable dielectric insulators (e.g. Kevlar ®) could be substituted for the insulating material.

In the card cage assemblies of FIGS. 4 and 5, the locations of the switch unit boards and processing element boards could be altered as necessary; for example, they could be reversed. Alternatively, the switch unit boards could be located in the center of the card cage, and the processing element boards could be positioned at the ends of the card cage.

The positioning of the cabling in the card cage could be suitably modified. For example, the cabling could be positioned below, behind, or in front of the card cage, rather than above the card cage, as illustrated in FIGS. 4 and 5.

The cable described herein can be used in any other system wherein matched propagation of signals is required to minimize signal skew. For example, it may be employed in a clock tree distribution system or in a circuit for synchronizing other types of signals to the various constituent units of a system.

It will also be apparent to one of ordinary skill that according to the present invention a cable can be constructed having turns in which the sum of the degrees of arc of the turns in one direction is not necessarily equal to the sum of the degrees of arc of the turns in the opposite direction, and in which the cable conductor signal paths are nonetheless identical. This is because, in the general case, the arc length of a turn in any given direction is proportional to the radius of the turn times the angle $\theta$ of the turn. So one could achieve a result comparable to that achieved through maintaining the sum of the degrees of arc of the turns in one direction equal to the sum of the degrees of arc of the turns in the opposite direction by maintaining equal the sums of the products of the average radius and angle $\theta$ of the turns in each direction. That is, a turn with a relatively small angle $\theta$ and relatively large radius can have an equal arc length to that of a turn with a relatively larger angle θ and relatively smaller radius.

Accordingly, it is intended by the appended claims to cover all modifications of the invention which fall within the true spirit and scope of the invention.

What is claimed is:

1. An electronic assembly comprising:
   a plurality of circuit boards, each containing connector means; and
   a plurality of multi-conductor, flexible, thin cables, each of said cables comprising means for coupling to said connector means, and the structure of each of said cables being such that, if positioned in a single plane, it has a plurality of substantially rigid turns, the sum of the degrees of arc of such turns in one direction being equal to the sum of the degrees of arc of such turns in the opposite direction, such that said conductors have equal lengths throughout the cable, wherein one of said circuit boards is connected to each of said other circuit boards through their respective connector means and an associated one of said plurality of cables.

2. An electronic assembly comprising:
   a plurality of circuit board enclosures;
   each of said circuit board enclosures comprising a plurality of circuit boards, each containing connector means; and
   a plurality of multi-conductor, flexible, thin cables, each of said cables comprising means for coupling to said connector means, and the structure of each of said cables being such that, if positioned in a single plane, it has a plurality of substantially rigid turns, the sum of the degrees of arc of such turns in one direction being equal to the sum of the degrees of arc of such turns in the opposite direction, such that said conductors have equal lengths throughout the cable, wherein one of said circuit boards is connected to each of said other circuit boards through their respective connector means and at least an associated one of said plurality of cables.

3. A multi-conductor, flexible, thin cable, the structure of said cable being such that, if positioned in a single plane, it has a plurality of substantially rigid turns, the sum of the degrees of arc of such turns in one direction being equal to the sum of the degrees of arc of such turns in the opposite direction, such that said conductors have equal lengths throughout the cable, and wherein said cable comprises a plurality of pairs of conductors, each conductor pair being separated by a ground conductor, and the outer, planar surfaces of the cable comprising ground layers.

4. The cable recited in claim 3 and further comprising at least one connector.

5. A multi-conductor, flexible, thin cable, the structure of said cable being such that, if positioned in a single plane, it has an equal number of substantially rigid left-hand and right-hand turns, such that said conductors have equal lengths throughout the cable, and said cable comprising a plurality of pairs of conductors, each conductor pair being separated by a ground conductor, and the outer, planar surfaces of the cable comprising ground layers.

6. The cable recited in claim 5 and further comprising at least one connector.

7. A cable for use in an electronic component package comprising a plurality of printed circuit boards spaced from one another in a housing, the structure of said cable being such that, if positioned in a single plane, it has a plurality of substantially rigid turns, the sum of the degrees of arc of such turns in one direction being equal to the sum of the degrees of arc of such turns in the opposite direction, such that said conductors have equal lengths throughout the cable, wherein said cable may be arranged to interconnect said printed circuit boards within said housing so as to permit relatively unobstructed air flow both between and above said printed circuit boards, and wherein said cable comprises a plurality of pairs of conductors, each conductor pair being separated by a ground conductor, and the outer, planar surfaces of the cable comprising ground layers.

8. The cable recited in claim 7 and further comprising at least one connector.

* * * * *